(12) United States Patent
Abou-Khalil et al.

(10) Patent No.: US 8,421,128 B2
(45) Date of Patent: Apr. 16, 2013

(54) SEMICONDUCTOR DEVICE HEAT DISSIPATION STRUCTURE

(75) Inventors: Michel J. Abou-Khalil, Essex-Junction, VT (US); Robert J. Gauthier, Jr., Hinesburg, VT (US); Tom C. Lee, Essex Junction, VT (US); Junjun Li, Williston, VT (US); Souvick Mitra, Essex Junction, VT (US); Christopher S. Putnam, Hinesburg, VT (US)

(73) Assignee: International Business Machines Corporation, Armonk, NY (US)

( * ) Notice: Subject to any disclaimer, the term of this patent is extended or adjusted under 35 U.S.C. 154(b) by 630 days.

(21) Appl. No.: 11/960,030

(22) Filed: Dec. 19, 2007

(65) Prior Publication Data

US 2009/0160013 A1    Jun. 25, 2009

(51) Int. Cl.
 *H01L 23/62* (2006.01)
(52) U.S. Cl.
 USPC ............................ 257/280; 257/347; 257/350
(58) Field of Classification Search ................ 257/734, 257/382, E21.507, 280–284, 401
 See application file for complete search history.

(56) References Cited

U.S. PATENT DOCUMENTS

| | | | |
|---|---|---|---|
| 4,242,595 A * | 12/1980 | Lehovec | 326/132 |
| 5,352,624 A * | 10/1994 | Miwa et al. | 438/155 |
| 5,376,823 A * | 12/1994 | Kojima et al. | 257/578 |
| 5,538,919 A | 7/1996 | Lebby et al. | |
| 6,191,476 B1 | 2/2001 | Takahashi et al. | |
| 6,218,891 B1 * | 4/2001 | Lotfi et al. | 327/431 |
| 6,407,445 B1 | 6/2002 | Vashchenko et al. | |
| 6,534,822 B1 * | 3/2003 | Xiang et al. | 257/316 |
| 6,740,548 B2 | 5/2004 | Darmawan | |
| 6,773,952 B2 | 8/2004 | Armbrust et al. | |
| 7,045,864 B2 * | 5/2006 | Funayama et al. | 257/369 |

* cited by examiner

*Primary Examiner* — Steven Loke
*Assistant Examiner* — Kimberly M Thomas
(74) *Attorney, Agent, or Firm* — Scully, Scott, Murphy & Presser, P.C.; Anthony J. Canale

(57) ABSTRACT

A heat generating component of a semiconductor device is located between two heavily doped semiconductor regions in a semiconductor substrate. The heat generating component may be a middle portion of a diode having a light doping, a lightly doped p-n junction between a cathode and anode of a silicon controlled rectifier, or a resistive portion of a doped semiconductor resistor. At least one thermally conductive via comprising a metal or a non-metallic conductive material is place directly on the heat generating component. Alternatively, a thin dielectric layer may be formed between the heat generating component and the at least one thermally conductive via. The at least one thermally conductive via may, or may not, be connected to a back-end-of-line metal wire, which may be connected to higher level of metal wiring or to a handle substrate through a buried insulator layer.

19 Claims, 15 Drawing Sheets

US 8,421,128 B2

SEMICONDUCTOR DEVICE HEAT DISSIPATION STRUCTURE

FIELD OF THE INVENTION

The present invention relates to semiconductor devices, and particularly to heat dissipation structures for semiconductor devices and methods of manufacturing the same.

BACKGROUND OF THE INVENTION

Most semiconductor devices generate heat during operation. Some semiconductor devices generate a significant amount heat that is enough to adversely impact device operation. While self-heating of semiconductor devices is alleviated to some degree in semiconductor devices built on bulk semiconductor substrates due to relatively high thermal conductivity of semiconductor materials, self-heating becomes very problematic in semiconductor devices built on semiconductor-on-insulator (SOI) substrate since a buried insulator layer has poor thermal conductivity.

Thus, a typical semiconductor device built on an SOI substrate is completely surrounded by insulators such as buried insulator layer, shallow trench isolation, and a middle-of-line (MOL) dielectric layer. Metal contacts to device terminals serve as the only heat sink for the semiconductor device. Components of the semiconductor device that do not have any metal contact are thus prone to self-heating in an SOI substrate.

An example of degradation of device characteristics is shown in FIG. 1A. An ideal current response 101 of a prior art electrostatic discharge (ESD) protection diode built on an SOI substrate and having a fixed parasitic resistance under a voltage pulse for 100 ns is shown in a dotted line. The duration of the voltage pulse simulates an electrostatic discharge event. The inverse of the slope in the ideal current response is the fixed parasitic resistance of the ideal electrostatic discharge protection diode. An actual current response 102 of the electrostatic discharge protection diode under the same conditions is shown in a solid line. The actual current response 102 may be much less than the ideal current response 101, particularly under a high voltage pulse. The ESD protection diode is not capable of handling a high voltage pulse as a fixed parasitic resistance model predicts, since self-heating increases the parasitic resistance of the ESD protection diode. While the ideal current response 101 and the actual current response 102 may, in general, vary depending on dimensions of ESD protection diodes on an SOI substrate, degradation of actual current responses may be observed in the ESD protection diodes when subjected to a high voltage pulse.

FIG. 2 offers a simple model for explaining the degradation in the performance of the prior art ESD protection diode. The resistance of the parasitic resistor on the ESD diode is a temperature dependent variable. While the two end terminals of the prior art ESD protection diode is contacted by metal contacts, the body of the prior art ESD diode is not contacted by any metal. Thus, the body of the prior art ESD diode is prone to self-heating, which causes increase in the parasitic resistance.

U.S. Pat. No. 6,740,548 to Darmawan discloses a prior art semiconductor structure to alleviate self-heating of a semiconductor device formed on an SOI substrate. A portion of a buried insulator layer is removed and replaced with a conductive semiconductor material so that heat may be dissipated through a handle substrate. However, this method requires alignment of a pattern in the buried insulator layer to a heat generating semiconductor device, as well as additional processing steps such as lithographic patterning and etching of portions of the buried insulator layer.

U.S. Pat. No. 6,407,445 to Vashchenko et al. discloses another prior art structure for limiting self-heating of a semiconductor device. However, a heat sink provided by this structure may not necessarily be close to a hot spot, or the location of maximum heat generation. Further, this structure requires additional area to place a heat sink adjacent to the semiconductor device.

In view of the above, there exists a need for a semiconductor structure that may limit self-heating in a semiconductor device built on an SOI substrate by providing a heat sink in proximity to a heat generating component of the semiconductor device to effectively remove heat, while not requiring many additional processing steps or additional device areas, and methods of manufacturing the same.

SUMMARY OF THE INVENTION

The present invention addresses the needs described above by providing semiconductor structures in which thermally conductive vias are placed as heat sinks in proximity to a heat generating component of a semiconductor device, and methods of manufacturing the same.

A heat generating component of a semiconductor device is located between two heavily doped semiconductor regions in a semiconductor substrate. The heat generating component may be a middle portion of a diode having a light doping, a lightly doped p-n junction between a cathode and anode of a silicon controlled rectifier, or a resistive portion of a doped semiconductor resistor. At least one thermally conductive via comprising a metal or a non-metallic conductive material is place directly on the heat generating component. Alternatively, a thin dielectric layer may be formed between the heat generating component and the at least one thermally conductive via. The at least one thermally conductive via may, or may not, be connected to a back-end-of-line metal wire, which may be connected to higher level of metal wiring or to a handle substrate through a buried insulator layer.

According to an aspect of the present invention, a semiconductor structure is provided, which comprises:

a first highly doped semiconductor region located directly beneath a top surface of a semiconductor substrate;

a second highly doped semiconductor region located directly beneath the top surface of the semiconductor substrate and disjoined from the first highly doped semiconductor region;

at least one doped semiconductor region located directly beneath the top surface of the semiconductor substrate and laterally abutting the first highly doped semiconductor region and the second highly doped semiconductor region; and at least one thermally conductive via located above and vertically abutting the at least one doped semiconductor region and comprising a conductive material, wherein the at least one doped semiconductor region is the only electrically biased component to which the at least one thermally conductive via is electrically connected.

According to another aspect of the present invention, another semiconductor structure is provided, which comprises:

a first highly doped semiconductor region located directly beneath a top surface of a semiconductor substrate;

a second highly doped semiconductor region located directly beneath the top surface of the semiconductor substrate and disjoined from the first highly doped semiconductor region;

at least one doped semiconductor region located directly beneath the top surface of the semiconductor substrate and laterally abutting the first highly doped semiconductor region and the second highly doped semiconductor region;

at least one thermally conductive via located above the at least one doped semiconductor region and comprising a conductive material, wherein the at least one thermally conductive via is electrically isolated from any electrically biased component; and a dielectric liner vertically abutting a bottom surface of the at least one thermally conductive via and the at least one doped semiconductor region, surrounding at least a bottom portion of the at least one thermally conductive via.

In one embodiment, the first highly doped semiconductor region has a doping of a first conductivity type, the second highly doped semiconductor region has a doping of a second conductivity type, the second conductivity type is the opposite of the first conductivity type, and the at least one doped semiconductor region is a single doped semiconductor region.

In another embodiment, the first highly doped semiconductor region has a doping of a first conductivity type, the second highly doped semiconductor region has a doping of a second conductivity type, the second conductivity type is the opposite of the first conductivity type, and the at least one doped semiconductor region is a laterally abutting pair of a first conductivity type semiconductor region and a second conductivity type semiconductor region, the first conductivity type semiconductor region laterally abuts the second highly doped semiconductor region, and the second conductivity type semiconductor region laterally abuts the first highly doped semiconductor region.

In even another embodiment, the at least one doped semiconductor region is a single doped semiconductor region having a doping of the same conductivity type as the first highly doped semiconductor region has and the second highly doped semiconductor region.

In yet another embodiment, the semiconductor substrate is a semiconductor-on-insulator (SOI) substrate having a handle substrate, a buried insulator layer, and a top semiconductor layer, and wherein each of a first highly doped semiconductor region, the second highly doped semiconductor region, and the at least one doped semiconductor region is located within the top semiconductor layer and vertically abuts the buried insulator layer.

In still another embodiment, the at least one thermally conductive via comprises one of an elemental metal, an intermetallic alloy, and polycrystalline diamond.

In still yet another embodiment, the semiconductor structure further comprises:

a first metal semiconductor alloy vertically abutting the first highly doped semiconductor region;

a second metal semiconductor alloy vertically abutting the second highly doped semiconductor region;

a dielectric material block vertically abutting the at least one doped semiconductor region and surrounding a lower portion of the at least one thermally conductive via; and a middle-of-line dielectric material located directly on the first metal semiconductor alloy, the second metal semiconductor alloy, the dielectric material block, and the at least one thermally conductive via, and disjoined from the at least one doped semiconductor region.

In a further embodiment, the at least one doped semiconductor region has a doping concentration from about $1.0 \times 10^{15}/cm^3$ to about $3.0 \times 10^{19}/cm^3$, and each of the first highly doped semiconductor region and the second highly doped semiconductor region has a doping concentration from about $3.0 \times 10^{19}/cm^3$ to about $3.0 \times 10^{21}/cm^3$.

In an even further embodiment, the at least one thermally conductive via is not connected to any metal wire.

In a yet further embodiment, the semiconductor structure further comprises at least one metal wire located above the at least one thermally conductive via, wherein the at least one thermally conductive via is connected to the at least one metal wire.

In a still further embodiment, the semiconductor structure further comprises:

a handle substrate located in the semiconductor substrate;

a buried insulator layer vertically abutting the handle substrate and each of the highly doped semiconductor region, the second highly doped semiconductor region, and the at least one doped semiconductor region;

at least another thermally conductive via vertically abutting the at least one metal wire and extending to a top surface of the semiconductor substrate; and at least one thermally conductive plug vertically abutting the at least another thermally conductive via and the handle substrate.

In a further another embodiment, each of the highly doped semiconductor region, the second highly doped semiconductor region, and the at least one doped semiconductor region comprises single crystalline semiconductor material having the same crystallographic orientations.

In a further another embodiment, the dielectric liner has a thickness from about 0.5 nm to about 30 nm, and preferably from about 1.5 nm to about 10 nm.

According to another aspect of the present invention, a method of forming a semiconductor structure is provided, which comprises:

forming a semiconductor device including:
  a first highly doped semiconductor region located directly beneath a top surface of a semiconductor substrate;
  a second highly doped semiconductor region located directly beneath the top surface of the semiconductor substrate and disjoined from the first highly doped semiconductor region;
  at least one doped semiconductor region located directly beneath the top surface of the semiconductor substrate and laterally abutting the first highly doped semiconductor region and the second highly doped semiconductor region; and forming at least one thermally conductive via directly on or in proximity of the at least one doped semiconductor region, wherein the at least one thermally conductive via comprises a conductive material and a distance between the at least one doped semiconductor region and the at least one thermally conductive via is less than about 30 nm.

In one embodiment, the at least one thermally conductive via is formed directly on the at least one doped semiconductor region, and wherein the at least one doped semiconductor region is the only electrically biased component to which the at least one thermally conductive via is electrically connected.

In another embodiment, the method further comprises forming a dielectric liner directly on a top surface of the at least one doped semiconductor region, wherein the dielectric liner directly contacts and surrounds at least a bottom portion of the at least one thermally conductive via and directly contacts a bottom surface of the at least one thermally conductive via, wherein the at least one thermally conductive via is electrically isolated from any electrically biased component.

In even another embodiment, the method further comprises forming at least one metal wire directly on the at least one thermally conductive via.

In yet another embodiment, the method further comprises:

providing a semiconductor-on-insulator substrate containing a handle substrate, a buried insulator layer, and a top semiconductor layer, wherein each of the first highly doped semiconductor region, the second highly doped semiconductor region, and the at least one doped semiconductor region is formed in the top semiconductor layer;

forming at least one thermally conductive plug directly on the handle substrate; and forming at least another thermally conductive via directly on the at least one thermally conductive plug, wherein the at least one metal wire is formed directly on the at least another thermally conductive via.

DETAILED DESCRIPTION OF THE INVENTION

Figure 1:
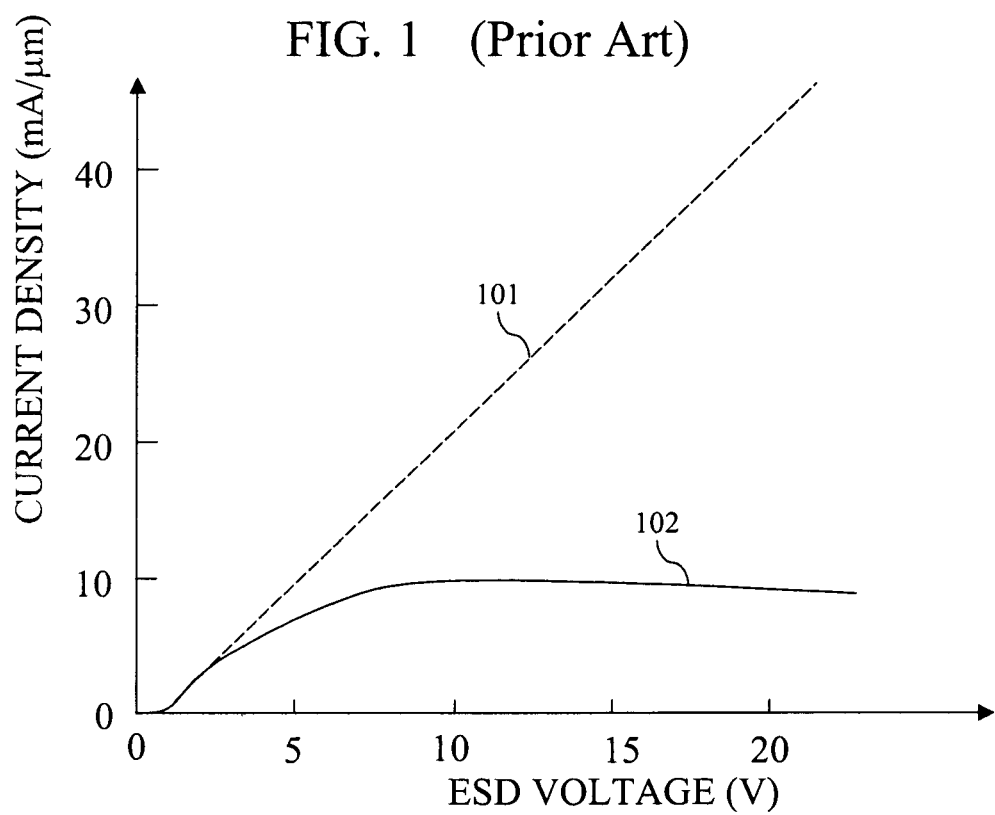
FIG. 1 is a graph showing an ideal current response 101 and an actual current response 102 of an electrostatic discharge (ESD) protection diode built on an SOI substrate.
Figure 2:
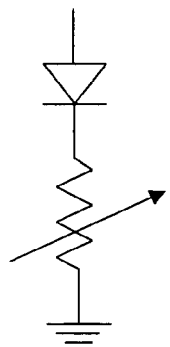
FIG. 2 is a circuit schematic for an ESD diode, in which the variability of parasitic resistance is explicitly shown.

As stated above, the present invention relates to heat dissipation structures for semiconductor devices and methods of manufacturing the same, which are now described in detail with accompanying figures. It is noted that like and corresponding elements are referred to by like reference numerals.

Figure 3:
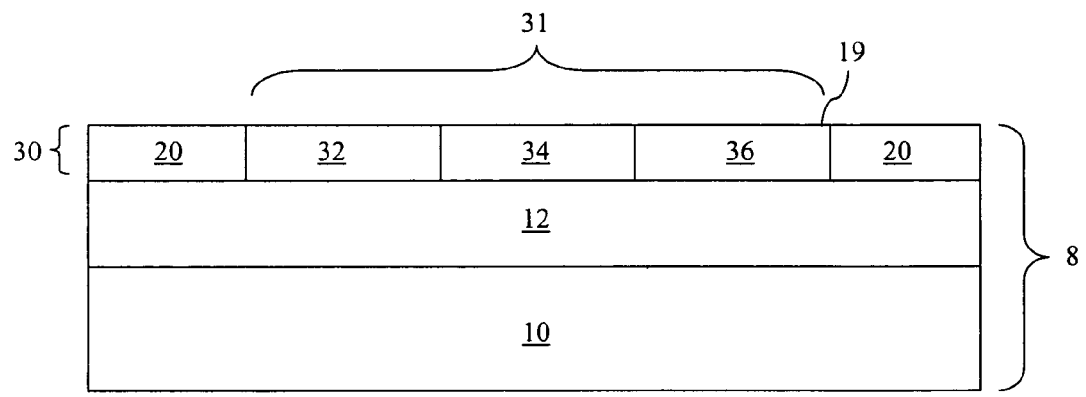
FIGS. 3-7 are sequential vertical cross-sectional views of a first exemplary semiconductor structure according to first embodiment of the present invention.

Referring to FIG. 3, a first exemplary semiconductor structure according to a first embodiment of the present invention comprises a semiconductor substrate 8 containing a handle substrate 10, a buried insulator layer 12, and a top semiconductor layer 30. The top semiconductor layer 30 contains a semiconductor device region 31 and shallow trench isolation 20. The thickness of the top semiconductor layer 30 may be from about 20 nm to about 300 nm, although lesser and greater thickness are herein contemplated also. Method of forming the shallow trench isolation 20 which comprises a dielectric material is well known in the art. The shallow trench isolation 20 may comprise dielectric oxide or dielectric nitride such as silicon oxide or silicon nitride.

The semiconductor device region 31 comprises a semiconductor material. The semiconductor material may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. In one embodiment, the semiconductor material comprises silicon. In another embodiment, the semiconductor material comprises gallium arsenide. Preferably, the semiconductor region is single crystalline, i.e., has the same crystallographic orientations throughout the volume of the semiconductor device region 31.

The semiconductor substrate 8 may be a semiconductor-on-insulator substrate as shown in FIG. 3. Alternately, the semiconductor substrate may be a bulk substrate or a hybrid substrate. The semiconductor device region 31 may have a built-in biaxial stress in the plane of the semiconductor device region 31, i.e., in the plane perpendicular to the direction of the surface normal of a top surface 19 of the semiconductor device region 31. While the present invention is described with an SOI substrate, implementation of the present invention on a bulk substrate or on a hybrid substrate is explicitly contemplated herein.

The semiconductor device region 31 comprises a first highly doped semiconductor region 32, a second highly doped semiconductor region 36, and a doped semiconductor region 34 therebetween. The doped semiconductor region 34 laterally abuts first highly doped semiconductor region 32 and a second highly doped semiconductor region 36. Further, each of the first highly doped semiconductor region 32, the second highly doped semiconductor region 36, and the doped semiconductor region 34 is formed directly beneath a top surface 19 of the semiconductor substrate 8.

A highly doped semiconductor region herein refers to a semiconductor region having a sufficiently high doping so that resistivity of the semiconductor region is at or close to a minimum value achievable. The highly doped semiconductor region thus offers a resistivity close to a lowest possible value. Typically, atomic concentration of the dopants, or the "dopant concentration," is from about $3.0 \times 10^{19}/cm^3$ to about $3.0 \times 10^{21}/cm^3$ for a highly doped semiconductor region comprising conventional semiconductor material such as silicon or gallium arsenide.

In one case, the first highly doped semiconductor region 32 has a doping of a first conductivity type, while the second highly doped semiconductor region 36 has a doping of a second conductivity type, wherein the second conductivity type is the opposite of the first conductivity type. For example, the first highly doped semiconductor region 32 may have a p-type doping, while the second highly doped semiconductor region 36 has an n-type doping, or vice versa. The doped semiconductor region 34 may have a doping of the first conductivity type, or alternatively, may have a second conductivity type doping. The doping concentration of the doped semiconductor region 34 may be from about $1.0 \times 10^{16}/cm^3$ to about $3.0 \times 10^{21}/cm^3$, and preferably from about $1.0 \times 10^{16}/cm^3$ to about $3.0 \times 10^{19}/cm^3$, i.e., the doped semiconductor region 34 preferably has a medium or low level of doping. Thus, the first exemplary semiconductor may comprise a lateral p-n diode containing a doped semiconductor region 34 having a lower doping concentration than a laterally abutting heavily doped semiconductor region (32 or 36) having the same type of doping at a higher doping concentration.

In another case, the first highly doped semiconductor region 32, the second highly doped semiconductor region 36, and the doped semiconductor region 34 have a doping of the same conductivity type, which may be p-type or n-type. The first highly doped semiconductor region 32 and the second highly doped semiconductor region 36 are heavily doped, i.e., have a doping concentration from about $3.0 \times 10^{19}/cm^3$ to about $3.0 \times 10^{12}/cm^3$. The doping concentration of the doped semiconductor region 34 may be from about $1.0 \times 10^{16}/cm^3$ to about $3.0 \times 10^{21}/cm^3$, and preferably from about $1.0 \times 10^{16}/cm^3$ to about $3.0 \times 10^{19}/cm^3$, i.e., the doped semiconductor region 34 preferably has a medium or low level of doping. Thus, the first exemplary semiconductor may comprise a lateral resistor containing a doped semiconductor region 34 having a lower doping concentration than the two laterally abutting heavily doped semiconductor regions (32, 36) having the same type of doping at a higher doping concentration.

Figure 4:
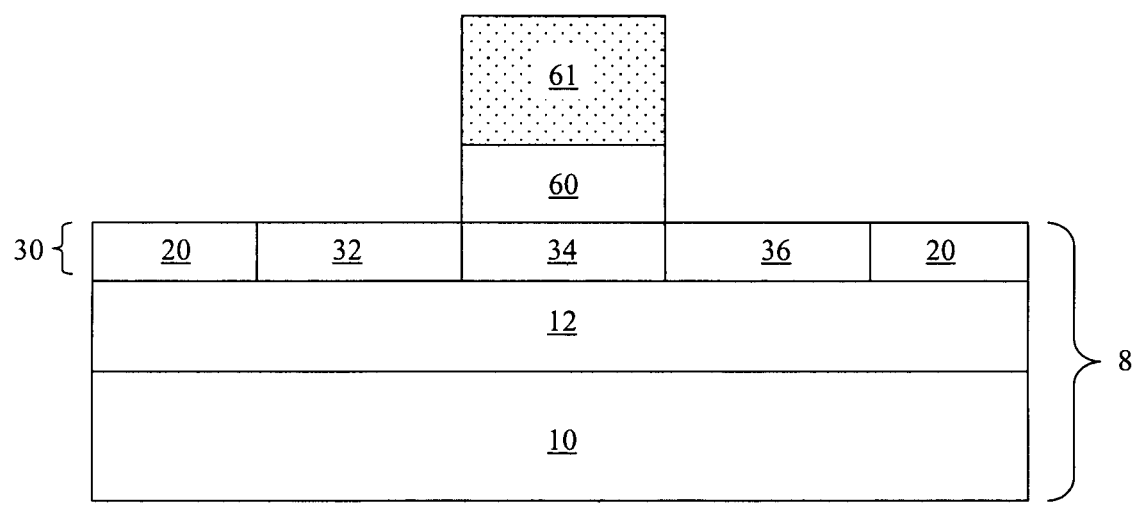

Referring to FIG. 4, a dielectric material block 60 is formed on the doped semiconductor region 34 by forming a dielectric material layer (not shown) on the semiconductor device region 31 and lithographically patterning the dielectric material layer. Specifically, a photoresist 61 is applied onto the dielectric material layer and lithographically patterned so that a portion of the photoresist 61 remains over the doped semiconductor region 34 after the patterning. The pattern on the photoresist 61 is then transferred into the dielectric material layer by a reactive ion etch. The reactive ion etch is preferably selective to the top semiconductor layer 30. The remaining portion of the dielectric material layer constitutes the dielectric block mask 60.

The dielectric material block 60 comprises a dielectric material that prevents formation of a metal semiconductor alloy on the doped semiconductor region 34 by blocking diffusion of the semiconductor material of the top semiconductor layer 30 or a metal that is subsequently deposited on the dielectric block mask during a metal semiconductor alloy formation step. The dielectric material block 60 may comprise a dielectric oxide or a dielectric nitride. For example, the dielectric material block 60 may comprise silicon nitride. The thickness of the dielectric material block 60 is thick enough to prevent diffusion of the semiconductor material or the metal therethrough, and may be from about 1 nm to about 200 nm, and preferably from about 10 nm to about 150 nm, and more preferably from about 70 nm to about 120 nm. The edges of the dielectric material block 60 may, or may not, be aligned to edges of the doped semiconductor region.

Figure 5:
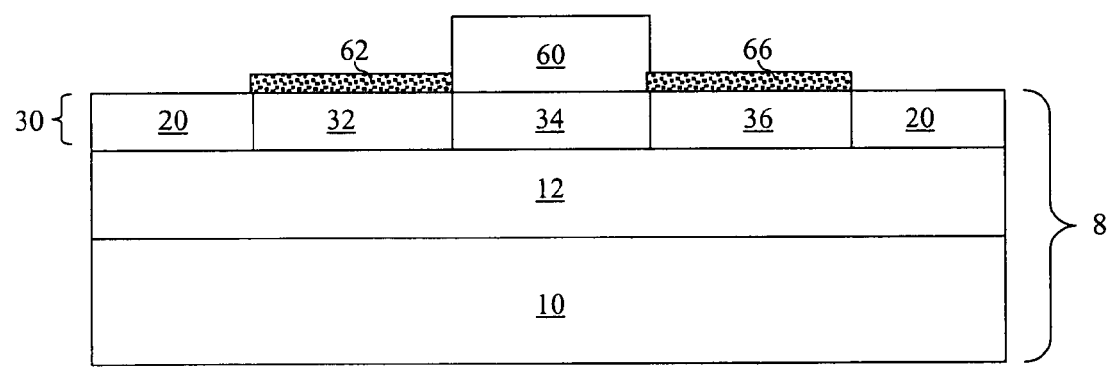

Referring to FIG. 5, metal semiconductor alloys are formed by metallization of exposed semiconductor surfaces. Specifically, a first metal semiconductor alloy 62 is formed on the first heavily doped semiconductor region 32, and a second metal semiconductor alloy 66 is formed on the second heavily doped semiconductor region 36. In case the first heavily doped semiconductor region 32 and the second heavily doped semiconductor region 36 comprise silicon, the first and second metal semiconductor alloys (62, 66) comprise metal silicides.

Figure 6:
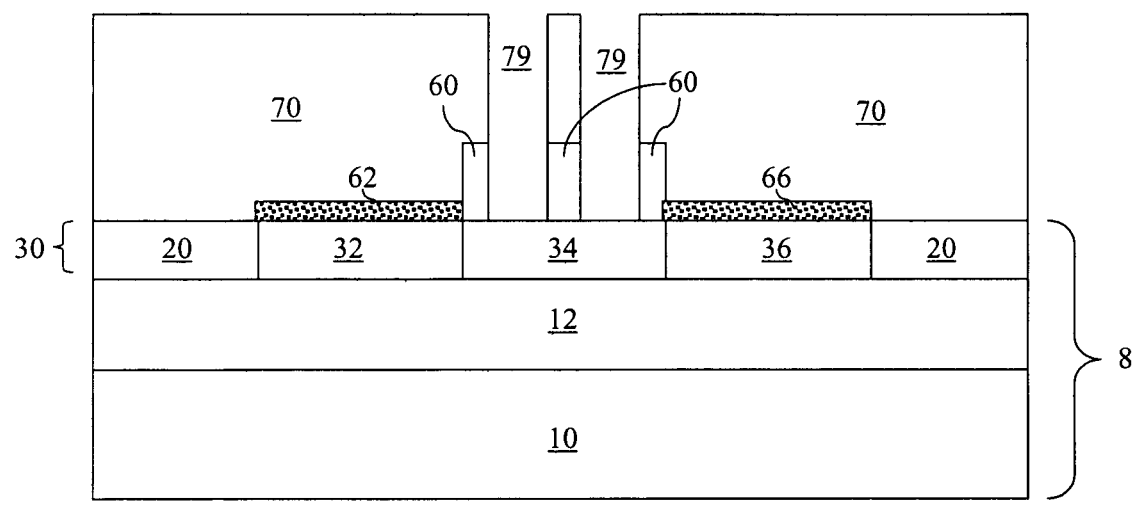

Referring to FIG. 6, a middle-of-line (MOL) dielectric layer 70 is formed on the metal semiconductor alloys (62, 66), the shallow trench isolation 20, and the dielectric material block 60. The MOL dielectric layer 70 may comprise a silicon oxide, a silicon nitride, a chemical vapor deposition (CVD) low-k dielectric material, a spin-on low-k dielectric material, or a stack thereof. The MOL dielectric layer 70 may contain a mobile ion diffusion barrier layer that prevents diffusion of mobile ions such as sodium and potassium from back-end-of-line (BEOL) dielectric layers. Further, the MOL dielectric layer 70 may contain a stress liner that applies tensile or compressive stress on underlying structures to alter charge carrier mobility in portions of the semiconductor substrate 8.

Non-limiting examples of the silicon oxide include undoped silicate glass (USG), borosilicate glass (BSG), phosphosilicate glass (PSG), borophosphosilicate glass (BPSG), fluorosilicate glass (FSG), and TEOS (tetra-ethyl-ortho-silicate) oxide. The silicon nitride may be a stoichiometric nitride, or a non stoichiometric nitride applying a tensile or compressive stress to underlying structures.

At least one via hole 79 is formed through the MOL dielectric layer 70 and the dielectric material block 60 down to a top surface of the doped semiconductor region 34 by a lithographic patterning and an anisotropic reactive ion etch. At the end of the anisotropic reactive ion etch, a portion of the doped semiconductor region 34 is exposed at the bottom of each of the at least one via hole 79. A lower portion of each of the at least one via hole is surrounded by the dielectric material block 60.

Figure 7:
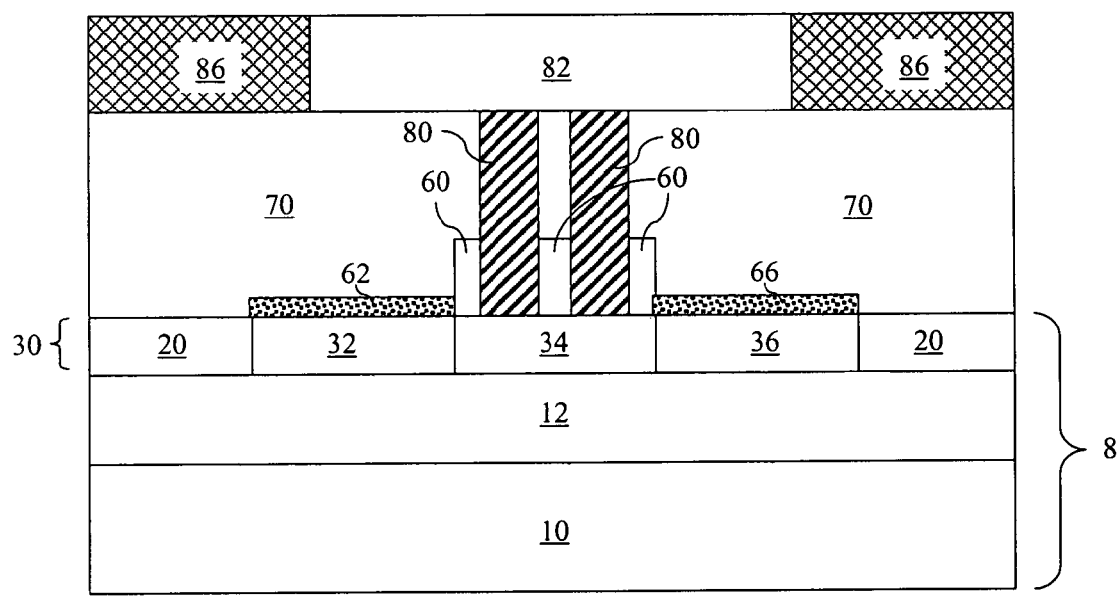

Referring to FIG. 7, the at least one via hole 79 is filled with a conductive material to form at least one thermally conductive via 80. The conductive material may be deposited, for example, by chemical vapor deposition (CVD). Excess conductive material above the MOL dielectric layer 70 is removed by chemical mechanical planarization, a recess reactive ion etch, or a combination thereof. The conductive material may comprise an elemental metal, an intermetallic alloy, or polycrystalline diamond. The intermetallic alloy is an alloy of at least two elemental metals. Polycrystalline diamond comprises carbon in the diamond phase and having a polycrystalline structure, and may be formed, for example, by chemical vapor deposition. The polycrystalline diamond has a high thermal conductivity.

Typically, the first heavily doped semiconductor region 32 and the second heavily doped semiconductor region 36 are provided with metal contacts (not shown), which may comprise the same material as the at least one thermally conductive via 80, and are connected to other semiconductor devices or input/output pads through back-end-of-line wiring including metal lines and metal vias.

A first wiring level dielectric layer 82, which is commonly called a "M1 dielectric layer," is formed on the MOL dielectric layer 70 and the at least one thermally conductive via 80. At a subsequent step at which first wiring level metal wires 86, commonly called "M1 lines," are formed, the first wiring level metal wires 86 do not adjoin the at least one thermally conductive via 80. Thus, the doped semiconductor region 34 is the only electrically biased component to which the at least one thermally conductive via 80 is electrically connected.

The doped semiconductor region 34 may have, and preferably has, a higher resistivity than the first heavily doped semiconductor region 32 or the second heavily doped semiconductor region 36. Thus, the doped semiconductor region 34 generates more heat than the first heavily doped semiconductor region 32 or the second heavily doped semiconductor region 36. In other words, the doped semiconductor region 34 is a primary heat generating component, or a "hot spot," of the first exemplary semiconductor structure, which may be a p-n junction diode or a resistor. The heat generated by the doped semiconductor region 34 is temporarily absorbed by the at last one thermally conductive via 80. Thus, in applications in which heat generation is instantaneous such as applications as an ESD protection diode which are subjected to a high voltage pulse having a duration on the order of about 100 ns, the at least one thermally conductive via 80 serves as a heat sink that may maintain the temperature of the doped semiconductor region 34 sufficiently low to maintain a low level of resistance throughout the duration of active operation of the semiconductor device incorporating the doped semiconductor region 34.

Figure 8:
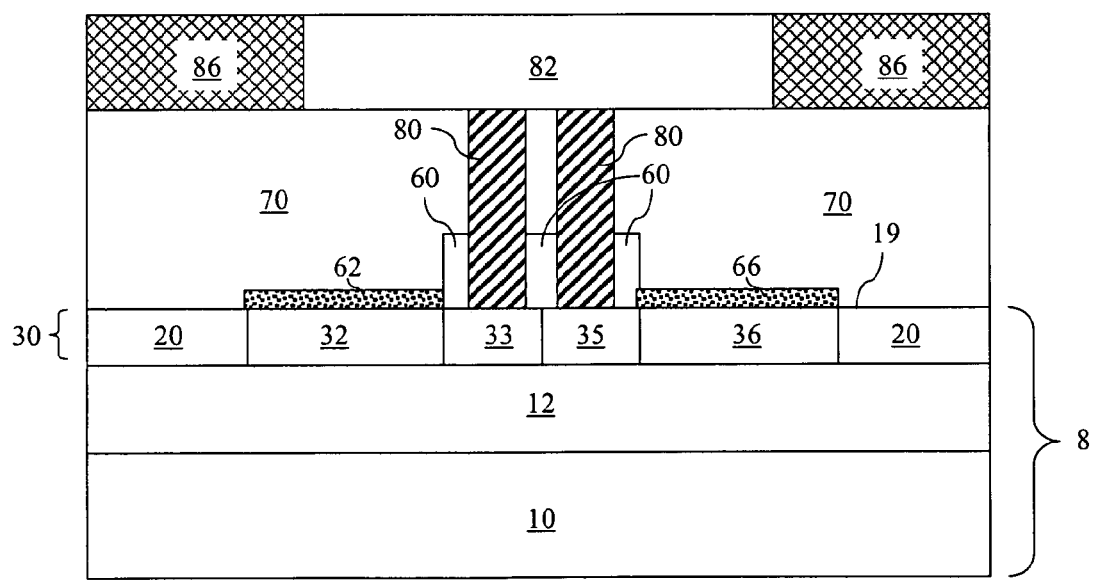
FIG. 8 is a vertical cross-sectional view of a second exemplary semiconductor structure according to a second embodiment of the present invention.

Referring to FIG. 8, a second exemplary semiconductor structure according to a second embodiment of the present invention comprises a laterally abutting pair of a first conductivity type semiconductor region 35 and a second conductivity type semiconductor region 33. Structurally, the laterally abutting pair (35, 33) of semiconductor regions replaces the doped semiconductor region 34 of the first exemplary semiconductor structure shown in FIG. 7. In terms of manufacturing methods, the laterally abutting pair (35, 33) of semiconductor regions is formed instead of the doped semiconductor region 34 at a step corresponding to FIG. 3 in the first embodiment. The rest of the structure and manufacturing methods may be the same as the first exemplary semiconductor structure.

The first conductivity type semiconductor region 35 laterally abuts the second highly doped semiconductor region 36, and the second conductivity type semiconductor region 33 laterally abuts the first highly doped semiconductor region 32. Both the first conductivity type semiconductor region 35 and the second conductivity type semiconductor region vertically abut the buried insulator layer 12 and a top surface of the top semiconductor layer 30.

The first conductivity type semiconductor region 35 has a doping of the first conductivity type, while the second conductivity type semiconductor region 33 has a doping of the second conductivity type. Thus, the second exemplary semiconductor structure is a p-n-p-n junction semiconductor controlled rectifier (SCR). The doping concentration of the first conductivity type semiconductor region 35 and the second conductivity type semiconductor region 33 may be from about $1.0 \times 10^{16}/cm^3$ to about $3.0 \times 10^{21}/cm^3$, and preferably from about $1.0 \times 10^{16}/cm^3$ to about $3.0 \times 10^{19}/cm^3$, i.e., the first and second conductivity type semiconductor regions (35, 33) preferably have a medium or low level of doping.

Formation of a dielectric material block 60, a first metal semiconductor alloy 62, a second metal semiconductor alloy 66, a MOL dielectric layer 70, and at least one thermally conductive via are the same as in the first exemplary semiconductor structure except for replacement of the doped semiconductor region 34 with the laterally abutting pair (35, 33) of semiconductor regions. At least one thermally conductive via 80 is formed.

A first wiring level dielectric layer 82 is formed on the MOL dielectric layer 70 and the at least one thermally conductive via 80. At a subsequent step at which first wiring level metal wires 86 are formed, the first wiring level metal wires 86 do not adjoin the at least one thermally conductive via 80. Thus, the laterally abutting pair (35, 33) of semiconductor regions is the only electrically biased component to which the at least one thermally conductive via 80 is electrically connected.

The laterally abutting pair (35, 33) of semiconductor regions may have, and preferably has, a higher resistivity than the first heavily doped semiconductor region 32 or the second heavily doped semiconductor region 36. Thus, the laterally abutting pair (35, 33) of semiconductor regions generates more heat than the first heavily doped semiconductor region 32 or the second heavily doped semiconductor region 36. In other words, the laterally abutting pair (35, 33) of semiconductor regions is a primary heat generating component, or a "hot spot," of the second exemplary semiconductor structure, which is a p-n-p-n junction semiconductor controlled rectifier (SCR). The heat generated by the laterally abutting pair of the first conductivity type region 35 and the second conductivity type region 33 is temporarily absorbed by the at last one thermally conductive via 80. Thus, in applications in which heat generation is instantaneous such as applications as an ESD protection SCR which are subjected to a high voltage pulse having a duration on the order of about 100 ns, the at least one thermally conductive via 80 serves as a heat sink that may maintain the temperature of the laterally abutting pair (35, 33) of semiconductor regions sufficiently low to maintain a low level of resistance throughout the duration of active operation of the semiconductor device incorporating the laterally abutting pair (35, 33) of semiconductor regions.

Figure 9:
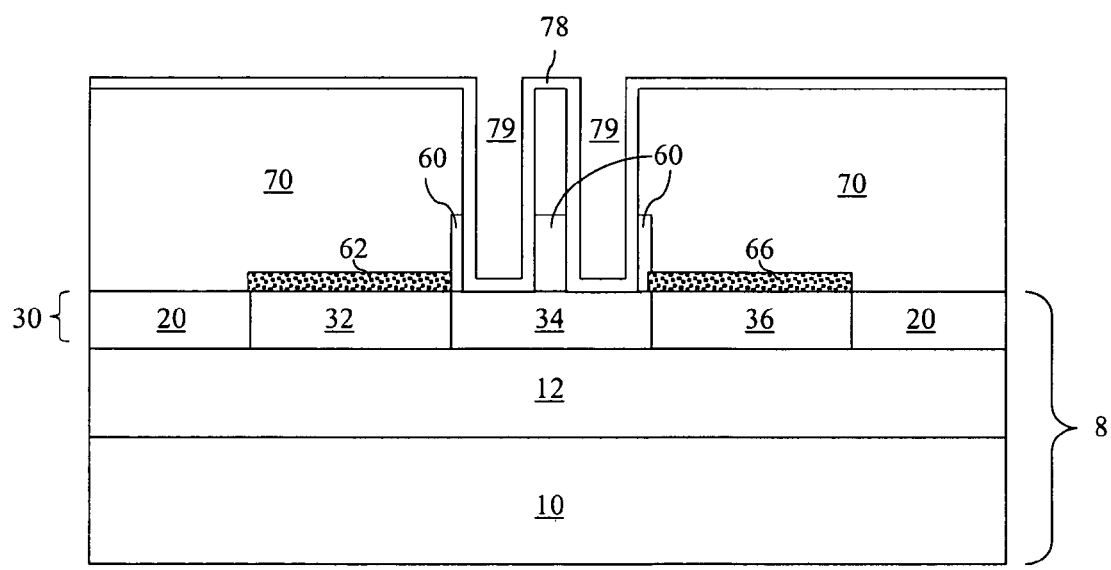
FIGS. 9 and 10 are sequential vertical cross-sectional views of a third exemplary semiconductor structure according to a third embodiment of the present invention.

Referring to FIG. 9, a third exemplary semiconductor structure according to a third embodiment of the present invention may be derived from the first semiconductor structure shown in FIG. 6. A variation of the third exemplary semiconductor structure may be derived from the second exemplary semiconductor structure at a processing step corresponding to FIG. 8 by replacing a doped semiconductor region 34 with a laterally abutting pair (35, 33) of semiconductor regions.

Prior to depositing a conductive material in the at least one via hole 79, a dielectric liner 78 comprising a dielectric material is deposited in the at least one via hole 79. Thus, the dielectric liner 78 directly contacts the doped semiconductor region 34 (or the laterally abutting pair (35, 33) of semiconductor regions in the variation) and inner sidewalls of the at least one via hole 79. The dielectric liner 78 may comprise a dielectric oxide or a dielectric nitride. For example, the dielectric liner 78 may comprise silicon oxide, silicon oxynitride, silicon oxynitride, or a stack thereof. The thickness of the dielectric liner may be from 0.5 nm to about 30 nm, and preferably from 1.5 nm to about 10 nm.

Figure 10:
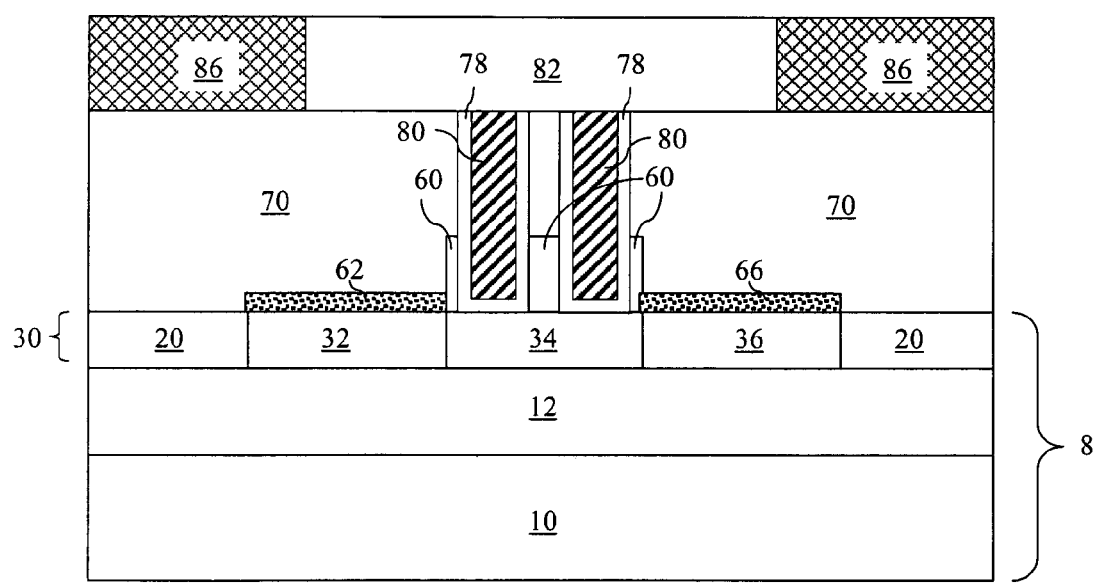

Referring to FIG. 10, at least one thermally conductive via 80 is formed directly on the inner surfaces of the dielectric liner 78, for example, by chemical vapor deposition (CVD). The at least one thermally conductive via 80 comprises the same material as in the first embodiment. The dielectric liner 78 vertically abuts a bottom surface of the at least one thermally conductive via 80 and the at least one doped semiconductor region 34 (or the laterally abutting pair (35, 33) of semiconductor regions in the variation), and surrounds at least a bottom portion of the at least one thermally conductive via 80. The dielectric liner 78 may surround the entirety of the sidewalls of the at least one thermally conductive via 80.

A first wiring level dielectric layer 82 is formed on the MOL dielectric layer 70 and the at least one thermally conductive via 80. At a subsequent step at which first wiring level metal wires 86 are formed, the first wiring level metal wires 86 do not adjoin the at least one thermally conductive via 80. Thus, the at least one thermally conductive via 80 is electrically isolated from any electrically biased component. Specifically, the at least one thermally conductive via 80 is electrically isolated from any other component located directly or indirectly on the semiconductor substrate 8.

The dielectric liner 78 provides electrical isolation between the doped semiconductor region 34 (or the laterally abutting pair (35, 33) of semiconductor regions in the variation) and the at least one thermally conductive via 80. However, the thickness of the dielectric liner 78 is thin enough to conduct a sufficient amount of heat generated in the doped semiconductor region 34 into the at least one thermally conductive via 80. Thus, the at least one thermally conductive via 80 functions as a heat sink, while being electrically isolated from the doped semiconductor region 34. The heat generated by doped semiconductor region 34 is temporarily absorbed by the at last one thermally conductive via 80, while the operation of the semiconductor device comprising the first heavily doped semiconductor region 32, the second heavily doped semiconductor region 36, and the doped semiconductor region 34 (or the laterally abutting pair (35, 33) of semiconductor regions in the variation) is not disturbed by the presence of the at least one thermally conductive via in the proximity of the doped semiconductor region 34. Thus, in applications in which heat generation is instantaneous and the semiconductor device is sensitive to disturbance by an electrically connected component, the combination of the at least one thermally conductive via 80 and the dielectric liner 78 provides an electrically isolated heat sink.

Figure 11:
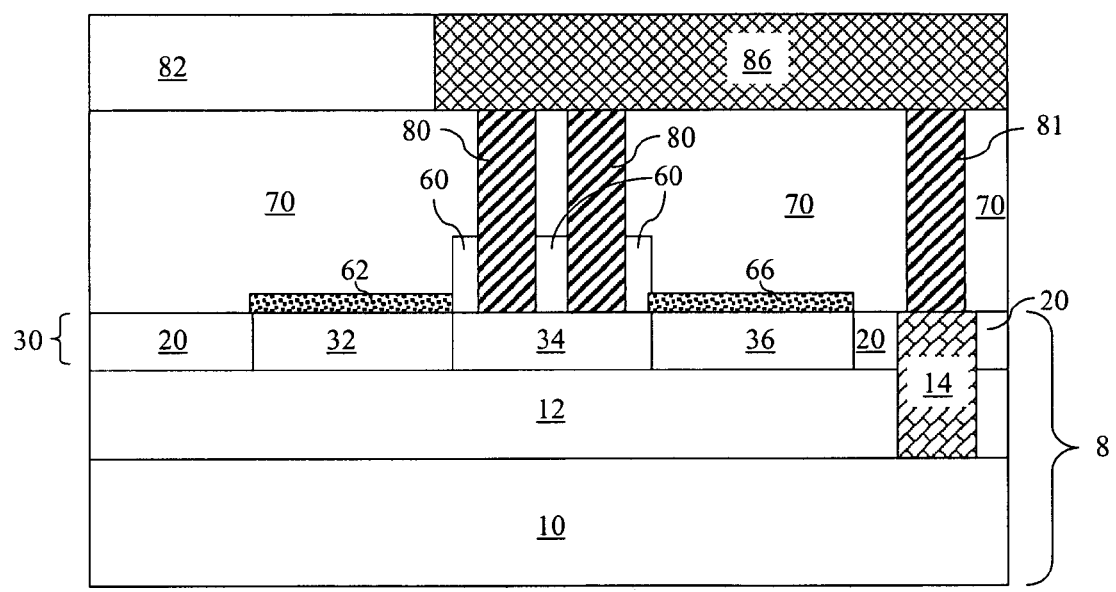
FIGS. 11-16 are vertical cross-sectional views of fourth through ninth exemplary semiconductor structures according to fourth through ninth embodiments of the present invention, respectively.

Referring to FIG. 11, a fourth exemplary semiconductor structure according to a fourth embodiment of the present invention is derived from the first exemplary semiconductor structure by forming at least one thermally conductive plug 14 prior to formation of the MOL dielectric layer 70. The at least one thermally conductive plug 14 is formed by patterning and removing a portion of the buried insulator layer 12 to expose a top surface of the handle substrate 10. Thus, the at least one thermally conductive plug 14 vertically abuts, and is electrically connected to the handle substrate 10. The handle substrate 10 may comprise a thermally conductive material such as a semiconductor material or metal. Typically, the handle substrate 10 comprises a semiconductor material such as silicon or gallium arsenide. The handle substrate 10 may be electrically grounded. In this case, the at least one thermally conductive plug 14 is electrically insulated from a heat source region, or the device containing the heat source region may be electrically grounded without adverse impacts on device operation. Alternately, the handle substrate 10 may be electrically floating to prevent biasing of the doped semiconductor region 34. In other words, the handle substrate 10 is not electrically biased. Consequently, the at least one thermally conductive plug 14 is not electrically biased though the handle substrate 10.

Preferably, the at least one thermally conductive plug 14 is formed within the shallow trench isolation 20 so that the at least one thermally conductive plug 14 is electrically isolated from other semiconductor components in the top semiconductor layer 30. The at least one thermally conductive plug 14 comprises a conductive material such as a doped semiconductor, a doped semiconductor alloy, a metal, an intermetallic alloy, or a metal semiconductor alloy. The doped semiconductor may be, for example, doped polysilicon or doped gallium arsenide. The doped semiconductor alloy may be, for example, doped silicon germanium alloy or a doped alloy of III-V compounds. The metal may be W, Ta, Ti, Ni, Co, Pt, Au, Ag, Al, or other elemental metal. The metal semiconductor alloy may be a metal silicide, a metal germanide, or a metallized III-V compound semiconductor.

At least another thermally conductive via 81 is formed in the MOL dielectric layer 70, preferably at the same processing step and employing the same methods as the at least one thermally conductive via 80. The at least another thermally conductive via 81 vertically abuts the at least one thermally conductive plug 14, and electrically and thermally connected to the thermally conductive plug 14, and consequently, electrically and thermally connected to the handle substrate 10.

At the processing step at which first wiring level metal wires 86, commonly called "M1 lines," are formed, a first wiring level metal wire 86 adjoin the at least one thermally conductive via 80 and the at least another thermally conductive via 81. Thus, the at least one thermally conductive via 80, the first wiring level metal wire 86, the at least another thermally conductive via 81, the at least one thermally conductive plug, and the handle substrate 10 are electrically and thermally connected. However, none of the above components is electrically biased, i.e., is not electrically connected to a voltage source or a current source. The doped semiconductor region 34 is the only electrically biased component to which the at least one thermally conductive via 80, the first wiring level metal wire 86, the at least another thermally conductive via 81, the at least one thermally conductive plug 14, and the handle substrate 10 are electrically connected. Any heat generated in the doped semiconductor region 34 is routed through the at least one thermally conductive via 80, the first wiring level metal wire 86, the at least another thermally conductive via 81, and the at least one thermally conductive plug 14, which function as intermediate heat sinks, to the handle substrate 10, which functions as the final heat sink.

Figure 12:
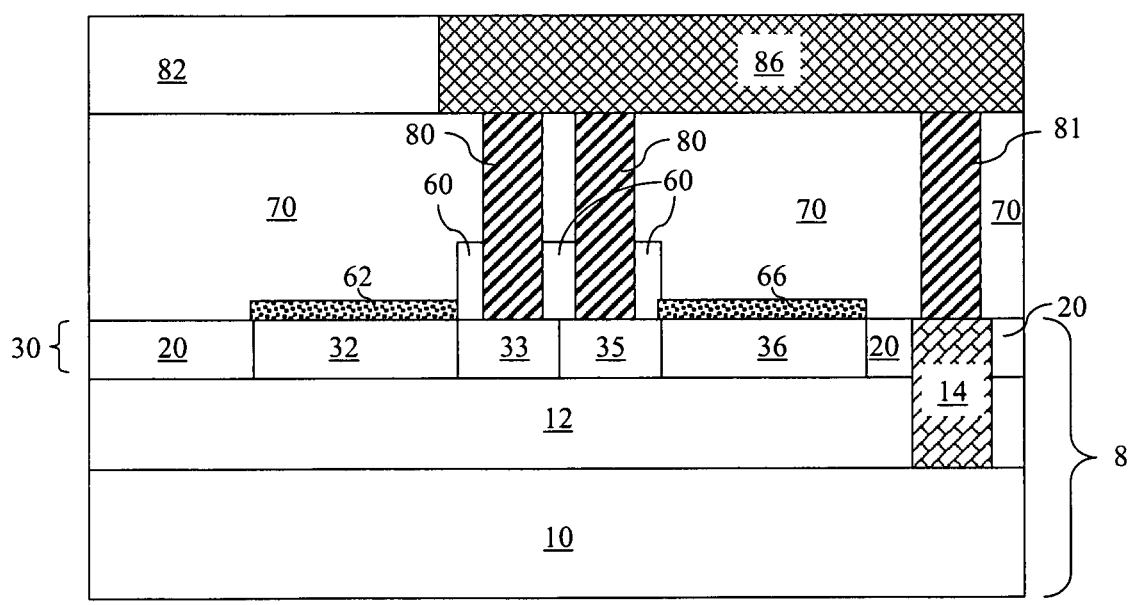

Referring to FIG. 12, a fifth exemplary semiconductor structure according to a fifth embodiment of the present invention comprises a laterally abutting pair of a first conductivity type semiconductor region 35 and a second conductivity type semiconductor region 33 as in the second embodiment. Structurally, the laterally abutting pair (35, 33) of semiconductor regions replaces the doped semiconductor region 34 of the fourth exemplary semiconductor structure shown in FIG. 11. In terms of manufacturing methods, the laterally abutting pair (35, 33) of semiconductor regions is formed instead of the doped semiconductor region 34 in the fourth embodiment. The rest of the structure and manufacturing methods may be the same as the fourth exemplary semiconductor structure.

The laterally abutting pair (35, 33) of semiconductor regions is the only electrically biased component to which the at least one thermally conductive via 80, the first wiring level metal wire 86, the at least another thermally conductive via 81, the at least one thermally conductive plug 14, and the handle substrate 10 are electrically connected. Any heat generated in the laterally abutting pair (35, 33) of semiconductor regions is routed through the at least one thermally conductive via 80, the first wiring level metal wire 86, the at least another thermally conductive via 81, and the at least one thermally conductive plug 14, which function as intermediate heat sinks, to the handle substrate 10, which functions as the final heat sink.

Figure 13:
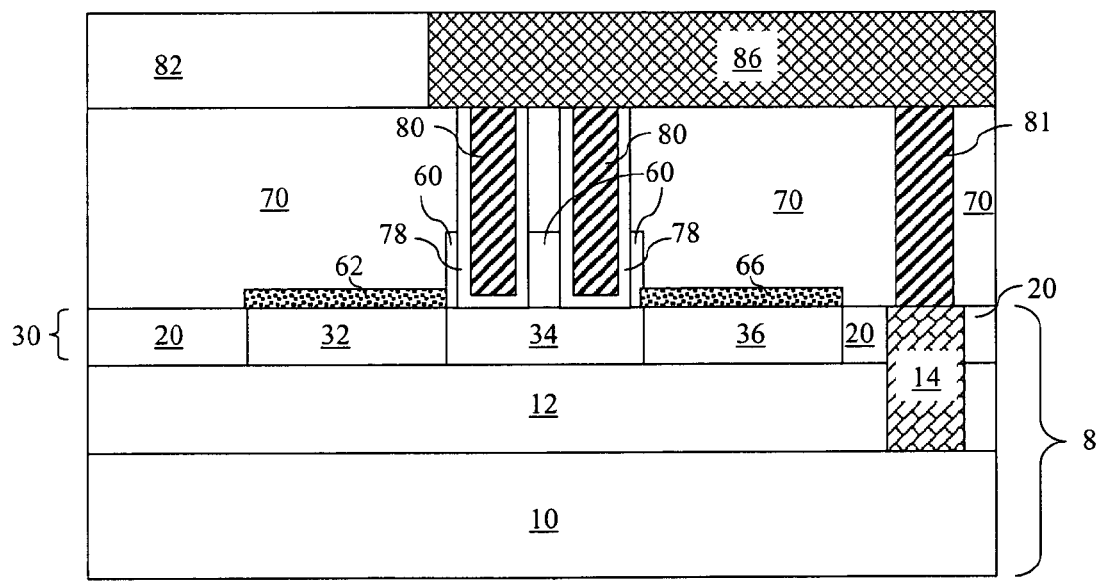

Referring to FIG. 13, a sixth exemplary semiconductor structure according to a sixth embodiment of the present invention comprises a dielectric liner 78 providing electrical isolation between the doped semiconductor region 34 (or the laterally abutting pair (35, 33) of semiconductor regions in a variation) and the at least one thermally conductive via 80. The sixth exemplary semiconductor structure is derived from the fourth exemplary semiconductor structure by forming the dielectric liner 78 after the formation of the at least one via hole 79 and prior to formation of the at least one contact via 80 as in the third embodiment. The composition and structure of the dielectric liner 78 is the same as in the third embodiment. The dielectric liner 78 may, or may not, be present on the at least another thermally conductive via 81. In case elimination of the dielectric liner 78 is desired around the at least another contact via, a masked etch of the dielectric liner 78 may be employed to remove a portion of the dielectric liner 78 in some areas including an area in which the at least another thermally conductive via 81 is to be formed, while preserving the dielectric liner 78 in another area in which the at least one thermally conductive via 80 is to be formed.

Preferably, the handle substrate 10 is floating as in the fourth and fifth embodiment. Further, none of the at least one thermally conductive via 80, the first wiring level metal wire 86, the at least another thermally conductive via 81, the at least one thermally conductive plug, and the handle substrate 10 may be electrically biased. Thus, the at least one thermally conductive via 80, the first wiring level metal wire 86, the at least another thermally conductive via 81, the at least one thermally conductive plug, and the handle substrate 10 functions as an electrically decoupled and thermally coupled heat sink. Any heat generated in the doped semiconductor region 34 (or the laterally abutting pair (35, 33) of semiconductor regions in the variation) is routed through the at least one thermally conductive via 80, the first wiring level metal wire 86, the at least another thermally conductive via 81, and the at least one thermally conductive plug 14, which function as intermediate heat sinks, to the handle substrate 10, which functions as the final heat sink.

Figure 14:
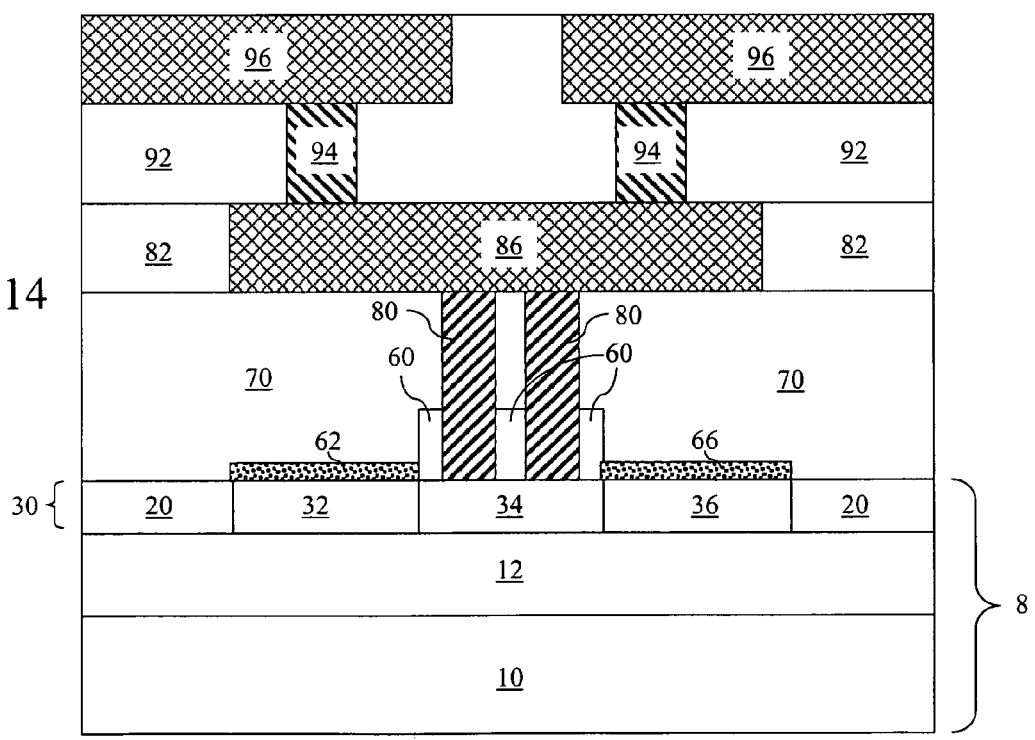

Referring to FIG. 14, a seventh exemplary semiconductor structure according to a seventh embodiment of the present invention is derived from the first exemplary semiconductor structure by forming a first wiring level metal wire 86 directly on the at least one thermally conductive via 80. This is in contrast with the first embodiment, in which first wiring level metal wires 86 do not adjoin the at least one thermally conductive via 80. Optionally, at least another back-end-of-line dielectric layer 92, at least another metal vias 94, and/or at least another metal lines 96 may be formed to increase thermal mass of contiguous thermally conducting components connected to the at least one thermally conductive via 80. None of the at least one thermally conductive via 80, at least another back-end-of-line dielectric layer 92, at least another metal vias 94, and at least another metal lines 96 is electrically biased. Thus, the doped semiconductor region 34 is the only electrically biased component to which the at least one thermally conductive via 80, the first wiring level metal wire 86, the at least another thermally conductive via 81, the at least one thermally conductive plug, and the handle substrate 10 are electrically connected.

The increased thermal mass of the thermally connected at least one thermally conductive via 80, at least another back-end-of-line dielectric layer 92, at least another metal vias 94, and at least another metal lines 96 provides enhanced heat sinking compared to the first semiconductor structure.

Figure 15:
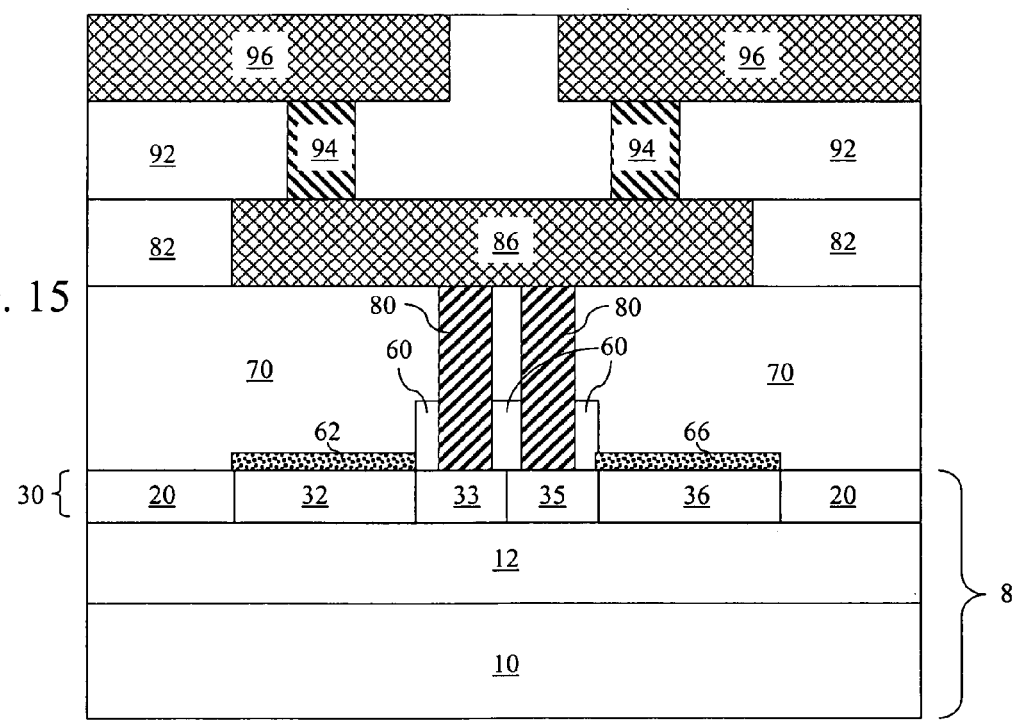

Referring to FIG. 15, an eighth exemplary semiconductor structure according to an eighth embodiment of the present invention comprises a laterally abutting pair of a first conductivity type semiconductor region 35 and a second conductivity type semiconductor region 33 as in the second embodiment. Structurally, the laterally abutting pair (35, 33) of semiconductor regions replaces the doped semiconductor region 34 of the seventh exemplary semiconductor structure shown in FIG. 14. In terms of manufacturing methods, the laterally abutting pair (35, 33) of semiconductor regions is formed instead of the doped semiconductor region 34 in the seventh embodiment. The rest of the structure and manufacturing methods may be the same as the seventh exemplary semiconductor structure. The increased thermal mass of the thermally connected at least one thermally conductive via 80, at least another back-end-of-line dielectric layer 92, at least another metal vias 94, and at least another metal lines 96 provides enhanced heat sinking compared to the second semiconductor structure.

Figure 16:
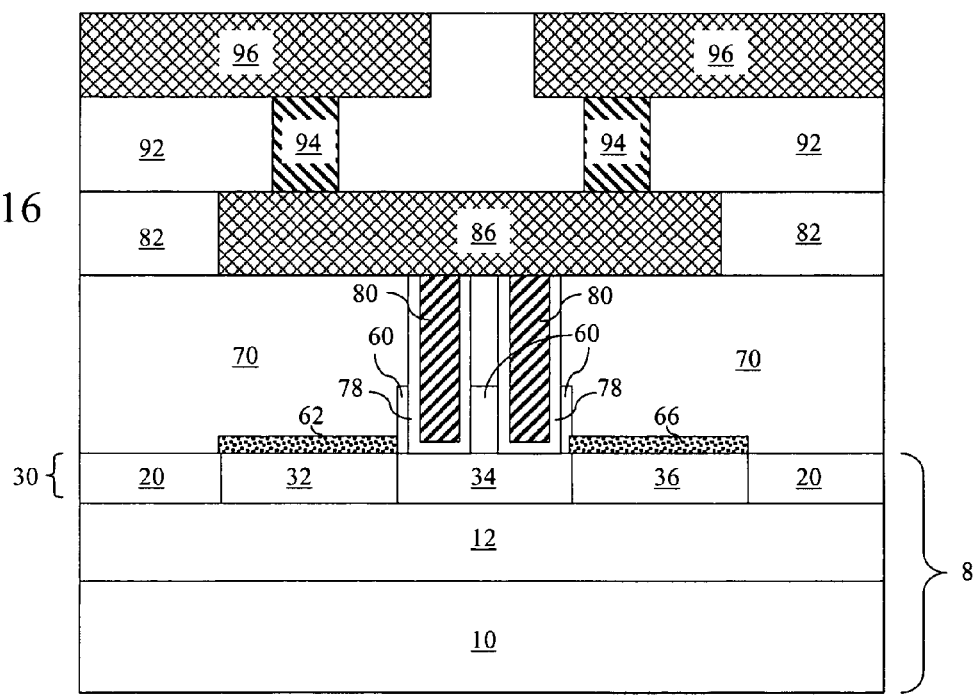

Referring to FIG. 16, a ninth exemplary semiconductor structure according to a ninth embodiment of the present invention comprises a dielectric liner 78 providing electrical isolation between the doped semiconductor region 34 (or the laterally abutting pair (35, 33) of semiconductor regions in a variation) and the at least one thermally conductive via 80. The ninth exemplary semiconductor structure is derived from the sixth (or seventh for the variation) exemplary semiconductor structure by forming the dielectric liner 78 after the formation of the at least one via hole 79 and prior to formation of the at least one contact via 80 as in the third embodiment. The composition and structure of the dielectric liner 78 is the same as in the third embodiment. After the formation of the at least one thermally conductive via 80, the rest of the structure and manufacturing methods may be the same as the seventh exemplary semiconductor structure. The increased thermal mass of the thermally connected at least one thermally conductive via 80, at least another back-end-of-line dielectric layer 92, at least another metal vias 94, and at least another metal lines 96 provides enhanced heat sinking compared to the third semiconductor structure.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor structure comprising:
a first highly doped semiconductor region located directly beneath a top surface of a semiconductor substrate;
a second highly doped semiconductor region located directly beneath said top surface of said semiconductor substrate and disjoined from said first highly doped semiconductor region;
at least one doped semiconductor region located directly beneath said top surface of said semiconductor substrate and laterally abutting said first highly doped semiconductor region and said second highly doped semiconductor region;
a middle-of-line (MOL) dielectric layer located on and above said semiconductor substrate;
at least one thermally conductive via located above and vertically abutting said at least one doped semiconductor region, embedded within said MOL dielectric layer, and comprising a conductive material;
metal contacts embedded within said MOL dielectric layer and connected to said first highly doped semiconductor region and said second highly doped semiconductor region;
at least one wiring level dielectric layer located above said at least one thermally conductive via and said metal contacts; and
back-end-of-line (BEOL) wiring structures including metal lines and metal vias, located above a top surface of said at least one thermally conductive via, and connecting said metal contacts to other semiconductor devices or input/output pads, wherein said at least one doped semiconductor region, said first highly doped semiconductor region, and said second highly doped semiconductor region are the only conductive components which are located in said semiconductor substrate and to which said at least one thermally conductive via is electrically connected, wherein said first highly doped semiconductor region has a doping of a first conductivity type, said second highly doped semiconductor region has a doping of a second conductivity type, said second conductivity type is the opposite of said first conductivity type, and said at least one doped semiconductor region is a single doped semiconductor region.

2. The semiconductor structure of claim 1, wherein said at least one doped semiconductor region is a single doped semiconductor region having a doping of the same conductivity type as said first highly doped semiconductor region has or said second highly doped semiconductor region.

3. The semiconductor structure of claim 1, wherein said semiconductor substrate is a semiconductor-on-insulator (SOI) substrate having a handle substrate, a buried insulator layer, and a top semiconductor layer, and wherein each of said first highly doped semiconductor region, said second highly doped semiconductor region, and said at least one doped semiconductor region is located within said top semiconductor layer and vertically abuts said buried insulator layer.

4. The semiconductor structure of claim 1, wherein said at least one thermally conductive via comprises one of an elemental metal, an intermetallic alloy, and polycrystalline diamond.

5. The semiconductor structure of claim 1, further comprising:
one of said metal contacts comprises a first metal semiconductor alloy vertically abutting said first highly doped semiconductor region;
one of said metal contacts comprises a second metal semiconductor alloy vertically abutting said second highly doped semiconductor region; and
a dielectric material block vertically abutting said at least one doped semiconductor region and surrounding a lower portion of said at least one thermally conductive via, wherein said MOL dielectric layer is located directly on said first metal semiconductor alloy, said second metal semiconductor alloy, said dielectric material block, and said at least one thermally conductive via, and is disjoined from said at least one doped semiconductor region.

6. The semiconductor structure of claim 1, wherein said at least one doped semiconductor region has a doping concentration from about $1.0 \times 10^{15}/cm^3$ to about $3.0 \times 10^{19}/cm^3$, and each of said first highly doped semiconductor region and said second highly doped semiconductor region has a doping concentration from about $3.0 \times 10^{19}/cm^3$ to about $3 \times 10^{21}/cm^3$.

7. The semiconductor structure of claim 1, further comprising at least one metal wire located above said at least one thermally conductive via, wherein said at least one thermally conductive via is connected to said at least one metal wire.

8. The semiconductor structure of claim 7, further comprising:
a handle substrate located in said semiconductor substrate;
a buried insulator layer vertically abutting said handle substrate and each of said first highly doped semiconductor region, said second highly doped semiconductor region, and said at least one doped semiconductor region;
at least another thermally conductive via vertically abutting said at least one metal wire and extending to said top surface of said semiconductor substrate.

9. The semiconductor structure of claim 1, wherein each of said first highly doped semiconductor region, said second highly doped semiconductor region, and said at least one doped semiconductor region comprises single crystalline semiconductor material having the same crystallographic orientations.

10. The semiconductor structure of claim 1, wherein said first highly doped semiconductor region, said second highly doped semiconductor region, and said at least one doped semiconductor region comprise a semiconductor material selected from silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials.

11. The semiconductor structure of claim 1, wherein said semiconductor substrate is a semiconductor-on-insulator substrate.

12. The semiconductor structure of claim 1, wherein said semiconductor substrate is a bulk substrate or a hybrid substrate.

13. The semiconductor structure of claim 1, wherein said first conductivity type is p-type and said second conductivity type is n-type.

14. The semiconductor structure of claim 1, wherein said first conductivity type is n-type and said second conductivity type is p-type.

15. The semiconductor structure of claim 1, wherein said MOL dielectric layer comprises a silicon oxide, a silicon nitride, a chemical vapor deposition (CVD) low-k dielectric material, a spin-on low-k dielectric material, or a stack thereof.

16. The semiconductor structure of claim 1, wherein said at least one thermally conductive via is a plurality of thermally conductive vias.

17. The semiconductor structure of claim 1, wherein the top surface of said at least one thermally conductive via is coplanar with a top surface of said MOL dielectric layer.

18. The semiconductor structure of claim 1, wherein said at least one doped semiconductor region has a higher resistivity than said first highly doped semiconductor region or said second highly doped semiconductor region.

19. The semiconductor structure of claim 1, further comprising a shallow trench isolation comprising a dielectric material and in contact with said first highly doped semiconductor region and said second highly doped semiconductor region.

* * * * *